United States Patent [19]

Doty et al.

[11] 4,062,610

[45] Dec. 13, 1977

[54] SQUARE MATRIX ELECTRICAL POST RECEPTACLE

[75] Inventors: Donald Judson Doty, Winston-Salem; Robert Philmore Reavis, Jr., Statesville, both of N.C.

[73] Assignee: AMP Incorporated, Harrisburg, Pa.

[21] Appl. No.: 693,238

[22] Filed: June 4, 1976

[51] Int. Cl.[2] ........................ H01R 13/62; H05K 1/12

[52] U.S. Cl. .............................. 339/75 M; 339/17 L; 339/95 D; 339/176 MP

[58] Field of Search ........ 339/75 M, 176 M, 176 MP, 339/950, 17 L, 17 LC, 252 R, 256 S, 258 R, 258 P

[56] References Cited

U.S. PATENT DOCUMENTS

| | | | |
|---|---|---|---|
| 3,750,086 | 7/1973 | Iversen | 339/75 M |
| 3,894,783 | 7/1975 | Messner | 339/258 R X |
| 3,941,445 | 3/1976 | Lacan | 339/75 M X |

*Primary Examiner*—Roy Lake
*Assistant Examiner*—E. F. Desmond
*Attorney, Agent, or Firm*—Robert W. Pitts; William J. Keating; Frederick W. Raring

[57] ABSTRACT

An interconnection system for attaching discrete wires to discrete posts mounted on a panel board and contained in a rectangular matrix is disclosed. The multi-contact connector utilizes cam activated terminals in a zero-insertion force, controlled minimum wipe configuration. Two rows of contact terminals have slotted wire receiving portions facing in opposite directions for mass insertion of discrete wires. The individual terminals have contact surfaces for establishing normal force contact with the posts without damage to the posts.

15 Claims, 13 Drawing Figures

86
84
88
14
8
10
74
76
12
82
96
98
4
2
d
6
90
S
92

10
16
14
18
40
12
50
70
66
38
20
80
26
68
72
94
60
d
30
22
28
58
44
46
48
36
34
24
25
32
42
52
54
56
62
64

SQUARE MATRIX ELECTRICAL POST RECEPTACLE

BACKGROUND OF THE INVENTION

1. Field of Invention

This invention relates to the electrical interconnection of separate groups of discrete electrically conductive elements. More specifically, this invention relates to the connection of a plurality of discrete conductors, such as round wires, to individual terminal posts mounted in a panel board and located in a closely spaced rectangular matrix. This invention also relates to a zero-insertion force, controlled minimum wipe connector having mass wire insertion capability.

2. Description of the Prior Art

Panel boards containing a rectangular matrix of upstanding electrically conductive terminal posts are utilized as electrical connection schemes in a variety of applications. For example, such a configuration might be used in a computer, in a television, or in a telecommunications system. One particular use of such a panel board-terminal post array would be for the interconnection of discrete wires with conductive paths on a printed circuit board. Appropriate terminals mounted on the printed circuit board could be mated with terminal posts extending from one surface of the panel board. A wire-wrap or other wire connection might then be made with other segments of individual terminal posts to form a continuous circuit.

U.S. Pat. No. Re26837 and U.S. Pat. No. 3,659,243 are representative examples of printed circuit board-terminal post integral connection systems. U.S. Pat. No. 3,821,693 also discloses a terminal which is used to establish contact with an elongated terminal element such as a terminal post.

Zero-insertion force connectors using a cam member to disengage and engage terminals have also been used quite extensively to form electrical interconnections. Many of these zero-insertion force connectors have employed directly as printed circuit board edge connectors. Two representative examples are disclosed and claimed in U.S. Pat. Nos. 3,426,313 and 3,495,132.

Multi-contact electrical connectors utilizing slotted terminals to form electrical connections with insulated wires are also commonly used. U.S. Pat. No. 3,760,335 discloses and claims a multi-contact electrical connector having two parallel rows of contact terminals with oppositely facing slotted wire-receiving portions adjacent to one end. Simultaneous mass insertion of a plurality of wires into the terminals in this connector is disclosed. U.S. Pat. No. 3,885,287 discloses and claims a multi-contact connector utilizing a particular tubular shaped terminal adjacent one end of a connector. Mass insertion of a plurality of wires in this connector is also possible.

SUMMARY OF THE INVENTION

The inventive concept disclosed herein relates to a conductor interconnection system employing an intermediate matrix of terminal posts mounted on a panel and a multi-contact post connector. Contact terminals contained in the connector housing have normal force post contact surfaces and wire receiving contacts such as slotted plates. The terminals are located in two parallel rows with the wire-receiving portions in alignment to facilitate simultaneous mass wire insertion. This connector may be of the zero insertion force type. A single cam member can be used to generate normal-force contact between the posts and connector terminals. The connector dimensions are defined by the terminal matrix dimensions. A plurality of connectors may be mounted end-to-end or row-to-row with contact being established with all of the terminal posts in the matrix.

The overall object of this invention is the simplification of wire handling in interconnection schemes employing panel-mounted terminal posts. The use of a practical multi-contact post-wire connector with a matrix of terminal posts is therefore contemplated. A device having mass wire handling capabilities with panel mounted terminal post matrices is therefore an ultimate objective. It is also an object of this invention to incorporate mass-wire insertion into such a multi-contact connector. A further object of this invention is that the post-wire interconnection be established without damage to the terminal posts. In achieving this objective, utilization is made of a zero insertion force type connector. Cam actuation of the connector terminals is therefore employed. Two generally incompatable features, close terminal spacing and the use of a cam member, must be incoıporated into a single connector design. Resolution of these incompatable objectives is thus a principal goal of this invention. In addition the use of non-noble metal interface, terminal to post and terminal to wire is an objective of this invention. The high normal force, zero insertion force controlled minimum wipe features of this invention are intended to achieve this objective.

DETAILED DESCRIPTION OF THE INVENTION

Figures 1, 2:
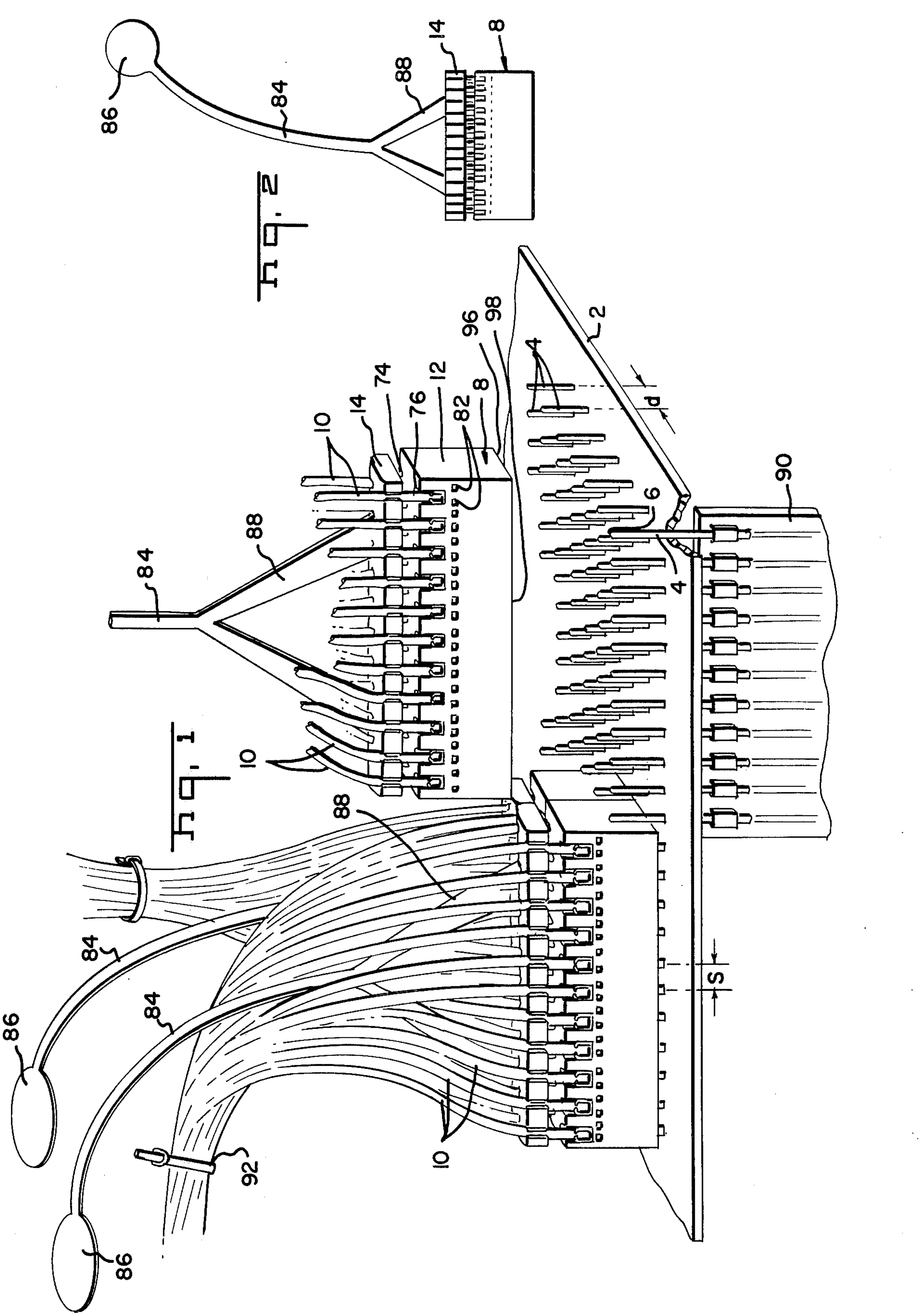
FIG. 1 is a perspective view showing a matrix of posts mounted in a panel board with a connector and a PC board mounted thereon.
FIG. 2 shows the actual size of the connector shown in FIG. 1, which would be used with terminal posts on a centerline spacing of 0.100 inch.

Connector 8 shown in FIG. 1 is intended to be used to interconnect a plurality of individual wires 10 to a corresponding plurality of terminal posts 4 mounted in a panel board 2. Terminal posts 4 are of a generally rectangular cross-section. One specific example of practical significance consists of square posts measuring 0.025 inch on each side. Panel boards having a rectangular or square matrix of terminal posts are utilized in various environments. For example, a panel board of this type could form a portion of the interconnection system of a computer. The panel board shown in FIG. 1 has terminal posts 2 extending from opposite sides thereof. A plurality of identical connectors 8 are shown mounted on the top of panel board 2. Each connector establishes contact with only a portion of the posts extending from panel board 2. FIG. 1 also illustrates the manner in which a printed circuit board 90 can be mounted on a panel board 2. It should be apparent from FIG. 1 that discrete connections have been made between a row of wires 10 and a row of conductive paths on printed circuit board 90.

Figures 3, 4, 5, 6, 7:
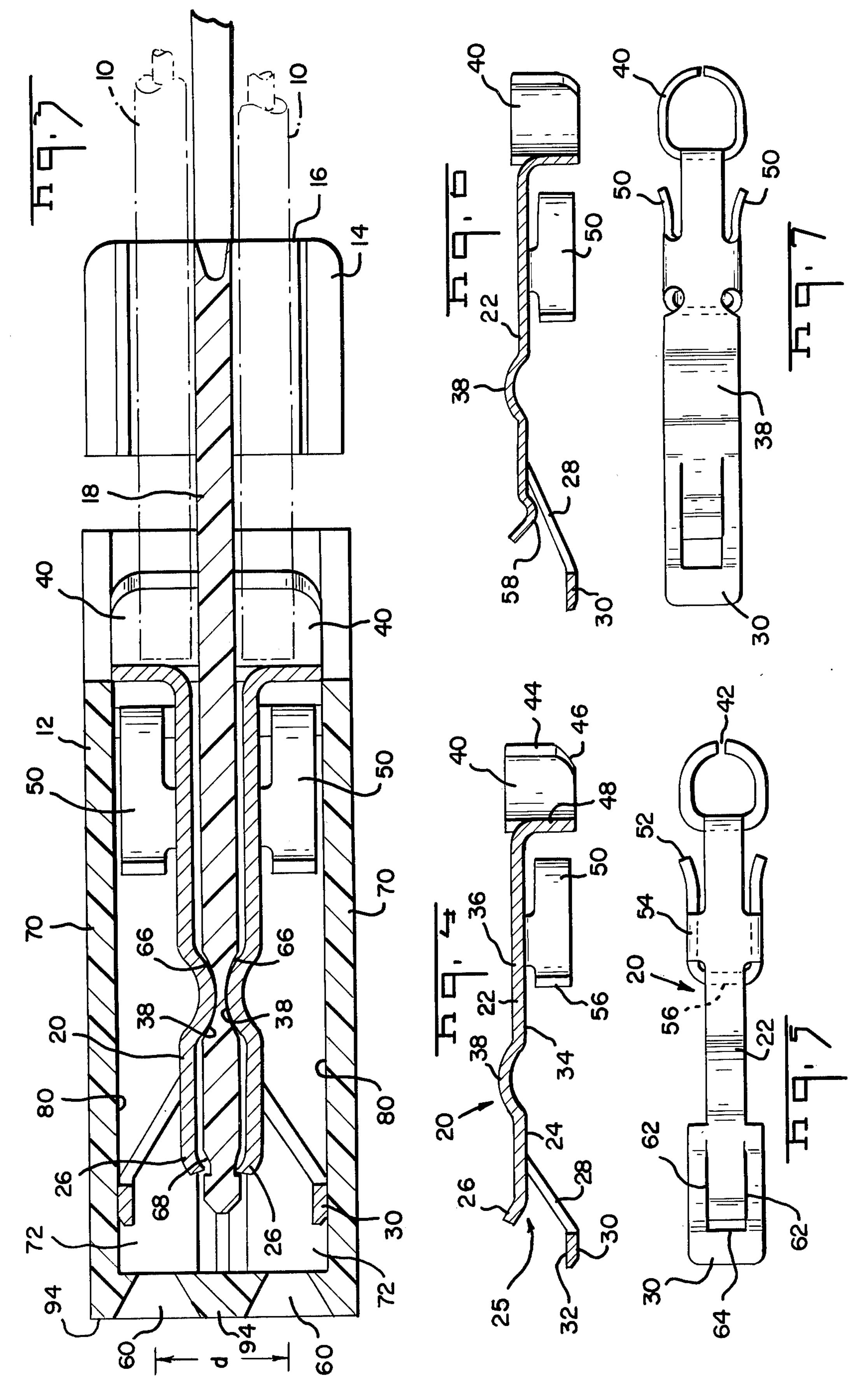
FIG. 3 shows the sectional view of a connector housing with two terminals and a linear cam mounted therein.
FIG. 4 is a sectional view of a single terminal.
FIG. 5 is a plan view of the terminal shown in FIG. 4.
FIG. 6 is a sectional view of an alternate embodiment of the terminal shown in FIG. 4.
FIG. 7 is a plan view of the terminal shown in FIG. 6.

The sectional view shown in FIG. 3 discloses the details of connector 8. A prismatic insulating housing body 12 has a forward end or face 94 which is rectangular. Face 94 has a width 96 and a length 98. Cavities 72 extend inwardly from forward face 94. These cavities each have an entrance portion 60, and the cavities are dimensioned to receive a single terminal post 4. A terminal 20 is located in each cavity 72. As shown in FIG. 3, housing 12 has two side by side cavities 72 with a terminal 20 located in each cavity. A linear cam member 18 is located between the two cavities shown in FIG. 3. Cam 18 is movable towards and away from forward face 94. Each terminal 20 has a contact surface 24 adjacent the forward face 94 and a wire receiving portion 40 adjacent the opposite or rear face of connector 8. The terminals are held in place in cavities 72 by locking arms 50. A strain relief cap 14 is located on the rear of cam 18 adjacent to wire receiving portions 40. The strain relief cap shown has channels 16 located on opposite sides thereof. These channels are for the receipt of wires 10 as depicted in FIGS. 1 and 3.

FIGS. 4 and 5 show an individual terminal. This is the same terminal which is shown mounted in connector 8 in FIG. 3. Terminal 20 has a shank portion 22 having a first face 34 and an opposite second face 36. A contact surface 24 is located on first face 34 adjacent to the left or forward end of terminal 20. An upwardly bent tang 26 is located on the extreme forward end of shank portion 22. Leg 28 extends from shank portion 22 in the vicinity of contact surface 24. As shown in FIG. 5, this terminal has two legs 28 extending from opposite edges of shank portion 22. Flange 32 is located on the extreme left on the forward end of legs 28. This flange joins opposite legs 28. Although not specifically shown, it should be apparent that a generally rectangular post receiving opening or window 25 is defined by contact surface 24, legs 28, and flange 30. Flange 30 has a contact surface 32 adjacent openings 60 and facing contact surface 24. A convex camming surface 38 is located on terminal second face 36 in the center of shank 22. In this embodiment, camming surface 38 is located adjacent to contact surface 24. Locking arms 50 are located to the right of camming surface 38 and are generally adjacent to the first face 34. These arms extend from opposite edges of the terminal. A stop portion 56 extends transverse to the longitudinal axis of terminal 20. These stop portions comprise deflected extensions of locking arm 50. A wire receiving portion 40 is located on the rear or extreme right of terminal 20. This wire receiving portion comprises a generally tubular barrel. A slot 42 having opposite edges 44 is formed in barrel 40 and extends along the entire length of the barrel. Note that slot 42 is generally perpendicular to the plane of shank 22 of terminals 20. Slot 42 has an entrance portion comprising diverging slot edges 47.

This entrance portion is spaced from the plane of shank 22.

Figure 8:
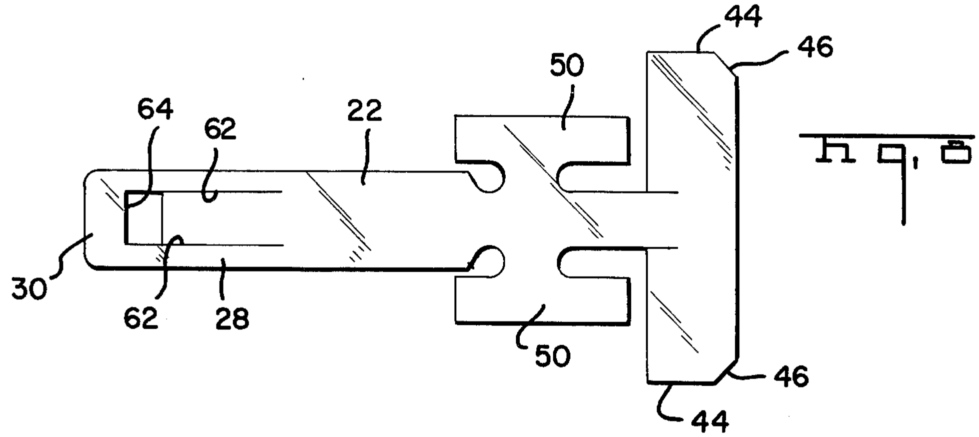
FIG. 8 is a blank used in forming a terminal shown in FIG. 6.

FIGS. 6–8 illustrate an alternate embodiment of the terminal shown in FIGS. 3–5. The primary difference between the alternate embodiment of the terminal and the principal embodiment is the presence of a contact localizing convex surface 58 on shank portion 22. The contact surface 24 shown in FIGS. 4 and 5 is generally flat. Convex surface 58 serves to isolate the contact point, thereby specifying the stresses in the terminal. Note that the shank portion 22 of the terminal shown in FIG. 7 also has a greater width than that shown in FIG. 5. These changes are intended to minimize the bending stress present in the shank portion of terminal 20.

FIG. 8 shows a blank from which the terminals shown in FIGS. 6 and 7 are formed. A similar blank would be used to form the terminals shown in FIGS. 4 and 5. Longitudinal slits 62 and transverse slit 64 define the shank contact 24 and legs 28. By deflecting legs 28 the spaced apart relationship between flange 30 and the shank 22 is formed. Locking arms 50 and integral post stops 56 are also formed by downwardly deflecting the arms shown in FIG. 8. Barrel 40 is formed by deflection of laterally extending segments 41 with the outer edges of segments 41 forming the slot edges 44 of barrel 40. Barrel 40 is deflected along dotted line 59 so that the axis 43 of barrel 40 extends perpendicular to shank 22.

Figure 9:
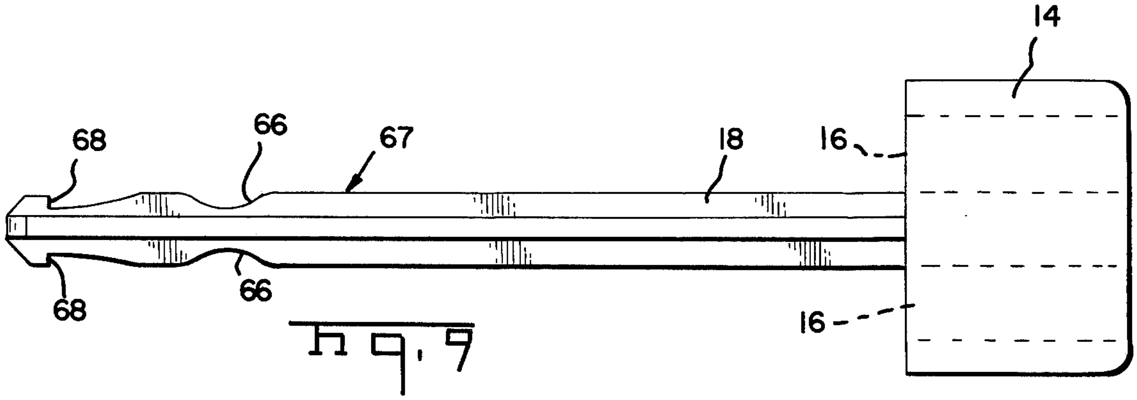
FIG. 9 is a side view of the cam member.
Figure 10:
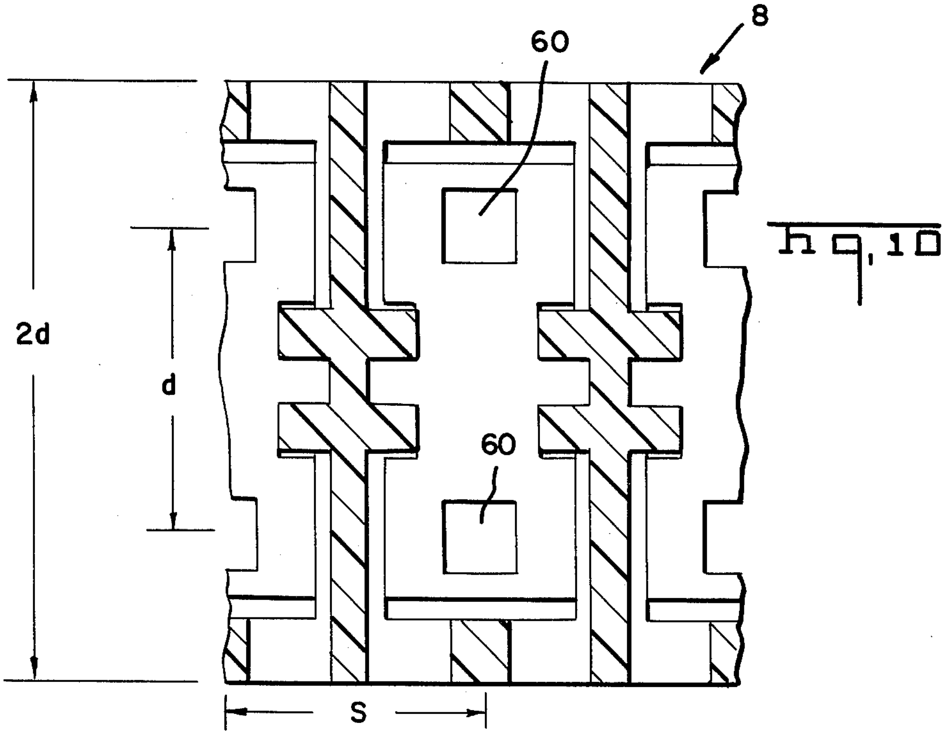
FIG. 10 is an end view showing the cavities located in the connector housing.
Figure 13:
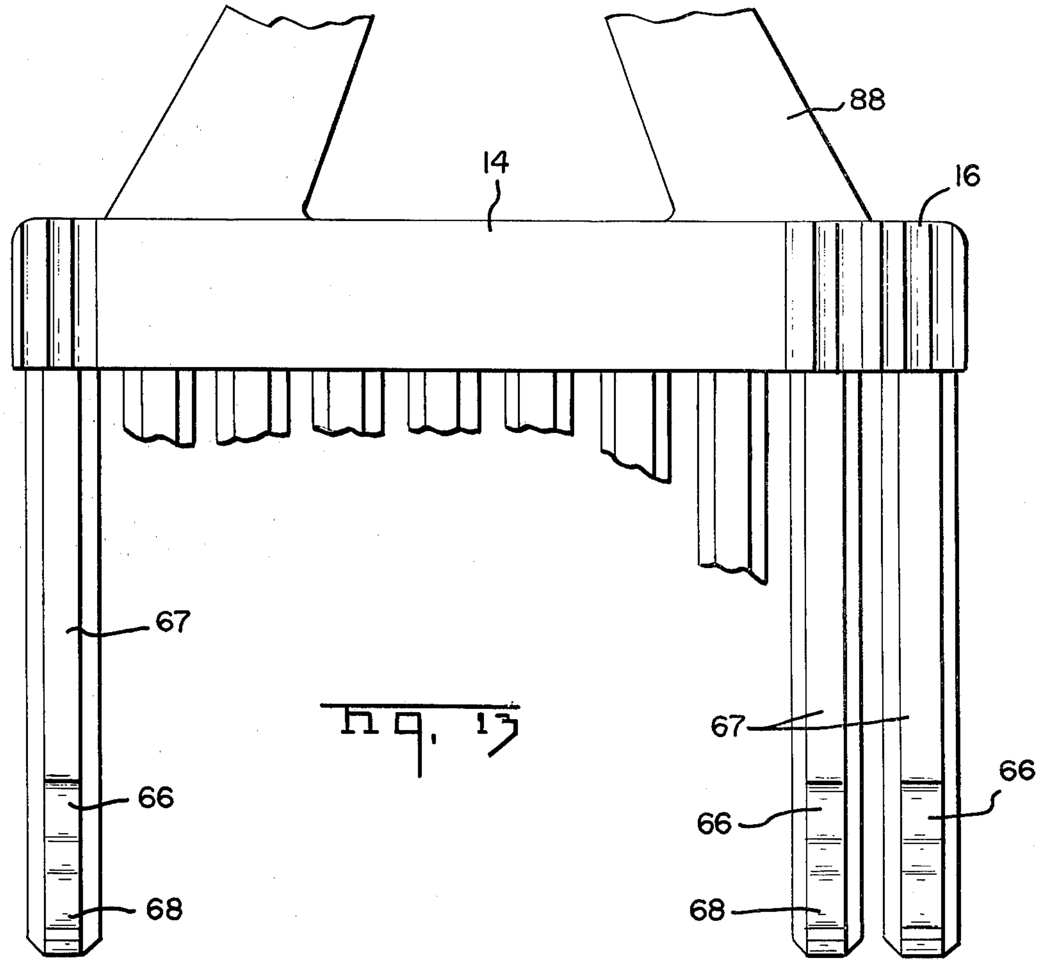
FIG. 13 is a description of the cam member showing separate extensions for each pair of cavities.

Cam 18 is shown in FIGS. 3 and 9. A plurality of fingers 67 extend from a strain-relief cap 14. Camming surfaces 66 are located on these fingers. Each finger is located between an appropriate pair of terminals, with strain relief cap 14 extending between the separate terminal rows. The cam therefore resembles a comb member. Actuation of a single cam 18 will then result in deflection of a plurality of terminals 20 in connector 8. Cam 18 has concave camming surfaces 66 located on opposite sides thereof. These concave surfaces 66 are diametrically opposed. A notch 68 is located near the forward end of the cam (the left as shown in FIG. 9). FIG. 3 illustrates that these notches receive the deflected tangs 26 on terminal 20. A strain relief cap 14 is located on the rear of cam 18. As noted above, this cap has channels 16 for reception of wires 10.

The connector 8 shown in the accompanying figures is primarily intended for use with a square or rectangular matrix of terminal posts. In FIG. 1, the spacing between adjacent terminal posts in the row of posts extending parallel to the forward edge of the panel board is identified by the distance "*s*". The spacing between adjacent rows of terminals is identified in FIG. 1 by the distance "*d*". In many instances, the panel boards of the type shown in FIG. 1 have a square matrix of terminal posts. In that case, the distances "*s*" and "*d*" would, of course, be equal. Connector 8 is intended for both side-by-side and end-to-end mounting as shown in FIG. 1. Note that a plurality of connectors are needed to form a contact with all of the posts extending from board 2. In order to achieve side-by-side mounting of connectors of this type, the external width 96 of each connector must be an integral multiple of the distance "*d*". The connector shown in FIG. 1 has two rows of cavities 72. Therefore, the external width 96 of this connector must be generally equal to and no greater than "*2d*". The center line spacing of adjacent parallel cavity rows 74 and 76 must be equal to "*d*". These connectors are also intended to be mounted end to end. By a similar process of reasoning, the external linear dimension 98 must be generally equal to and no greater than an integral multiple of the distance "*s*". Also, the spacing between cavities in each row must be equal to the distance "*s*".

FIG. 2 shows the actual size of a connector which contemplated in relation to this invention. This connector is intended to be a zero-insertion force connector. The connector is mounted on panel board 2 with individual posts 4 extending into individual cavities 72. Significant contact between terminals 20 and posts 72 is not generated during insertion of the post into the connector. Intimate electrical contact is established by the movement of cam 18 toward forward face 94. Prior to activation of cam 18, convex terminal surfaces 38 are located in concave cam surfaces 66. As the cam moved towards the forward face 94 of the connector, the shank portion and contact surface 24 are deflected into contact with a terminal post extending through opening 60. Flange 30 is located along the inner wall 70 of cavity 72. Terminal post 4 is brought into contact with contact surface 32 on flange 30. Note that activation of cam 18 causes contact surfaces 24 and 32 to constrict about the periphera of a post 4. As surfaces 24 and 32 come into contact with post 4, a slight wiping action occurs and high normal contact forces are also developed. A secure redundant electrical contact is thereby established. Electrical contact has been established without significantly damaging the exterior of post 4, because the intimate contact surface is tangential to the terminal post.

In view of the relatively small size of connector 8, the use of a linear cam mounted between two rows of terminals is particularly significant. A typical use of this invention would be with a panel board having terminal posts mounted in a square matrix in which the center lines of the post are spaced apart by a distance of 0.100 inch (0.254 cm.) A standard terminal post would have a square cross-section measuring 0.025 inch (0.064 cm.) on each side. It should be apparent, therefore, that relatively little space that is available for cam activation. Use of a single linear cam to activate two rows of terminals leads to an important space saving configuration.

This invention facilitates the attachment of wires to terminals 20. Using the barrel terminal 40, as shown, contact is established with each wire by moving the insulating wire laterally of its local axis into slots 42. Since slots 42 in both terminal rows face outward, wires can be attached to terminals in both rows simultaneously.

Removal of an individual connector mounted on panel board 2 is achieved by using tab 84. Tab 84 is attached to strain relief cap 14 by means of straps 88. A tensile force applied to tab 84 and directed away from panel baord 2 will release cam 18. Tangs 26 will engage notches 68 as the terminals are freed from physical contact with posts 4. The entire connector can then be pulled completely free of the terminal posts. This invention employs several other features shown in FIG. 1. For example, a label 86 attached to tab 84 can be used to identify appropriate connectors.

Figure 11:
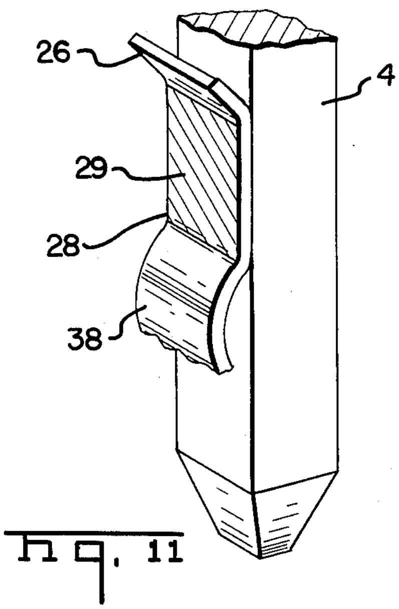
FIG. 11 is a schematic illustrating an area contact.
Figure 12:
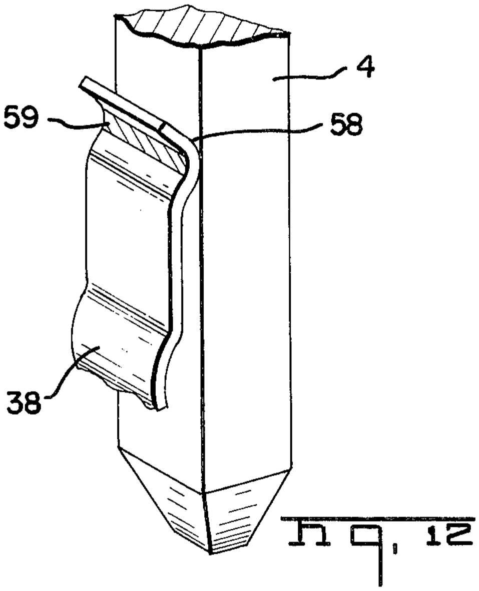
FIG. 12 is a schematic illustrating a line contact.

One other feature of this invention is significant. In forming a high-normal force, controlled minimum wipe contact with a terminal post having a generally rectangular cross-section it is necessary to avoid damage to the edges of the terminal posts. Both the embodiment of FIG. 4 and FIG. 6 account for this necessity. In each embodiment, an intimate contact is formed tangential to and parallel to at least one face of the rectangular post 4. The configuration of FIG. 4 should result in an area contact. The configuration of FIG. 6 should in contrast result in a line contact. The schematic views of FIGS. 11 and 12 illustrate these tangential intimate contacts. FIG. 11 is representative of the configuration of FIG. 4. Note that cross-hatched area contact 29 is tangential to one side of terminal 4. FIG. 12 represents the configuration of FIG. 6. Note that the cross-hatched line contact 59 is tangential to one side of terminal 4.

High normal force is not the only requisite for satisfactory electrical contact. A certain amount of wiping action is desirable to break down the oxides on the exterior of metallic contact elements. Intimate contact is thereby established with the underlying metallic conductor. Excess wiping action results in a buildup of debris between adjacent contact elements. As contact surfaces 28 or 58 on the appropriate terminal are cammed into contact with posts 4, a controlled minimum wipe between terminals 20 and posts 4 occurs. A similar wiping action occurs between contact surface 32 and post 4. It should be apparent that this controlled minimum wipe occurs because the deflection of the terminal by the cam results in a slight longitudinal motion of the terminal relative to the post. Generally this longitudinal movement which causes the wiping action will be less than the displacement of said terminal which generates the necessary normal force.

What is claimed is:

1. An electrical connector for establishing contact with a plurality of terminal posts which are located in an *x*-*y* matrix, the spacing between adjacent posts in the *x*-direction being equal to *d*, the spacing between adjacent posts in the *y*-direction being equal to *s*, said connector comprising:

a prismatic housing with a forward face which has a width generally equal to and no greater than 2*d*, and a length generally equal to and no greater than an integral multiple of said distance *s*, two parallel side-by-side rows of elongated cavities extending inwardly from said forward face into said housing, the centerlines of said rows being spaced apart by said distance *d*, the centerlines of adjacent cavities in each of said rows being spaced apart by said distance *s*, camming means located between said two rows, said camming means being actuated from the rear of said housing, said camming means comprising a linear cam movable towards and away from said forward face, between said two adjacent rows, a plurality of spring metal contact terminals, one terminal in each of said cavities, each of said terminals being adjacent to said camming means, whereby a plurality of said connectors can be placed side-by-side and end-to-end with said posts extending into said cavities whereupon said camming means can be actuated and said contact terminals will establish contact with said posts.

2. An electrical interconnection between a plurality of discrete electrical conductors and a similar plurality of conductive paths comprising:

a panel-board with a matrix of electrically conductive posts mounted thereon and extending perpendicular thereto, electrical interconnections between said plurality of conductive paths and said posts, an insulating housing comprising two parallel rows of cavities extending inwardly from one face thereof, said posts extending into said cavities, contact terminals in said cavities, said contact terminals being in intimate electrical contact with said posts, adjacent rows of contact terminals being generally between adjacent rows of posts, conductor receiving means on each of said terminals, one of said discrete electrical conductors extending from each of said conductor receiving means for each interconnection, a camming member extending between said two rows, said terminals in each of said rows being located between said posts and said camming member, whereby said conductive paths are electrically connected to said discrete electrical conductors utilizing intermediate posts and terminals.

3. An electrical interconnection as set forth in claim 2 wherein said camming member comprises a linear cam movable towards and away from said panel board, parallel to and between said rows of terminals.

4. An electrical interconnection as set forth in claim 2 wherein said conductor receiving means on said terminals in opposite rows face in opposite directions, generally perpendicular to said two parallel rows, said conductor receiving means comprising wire receiving slots formed by two adjacent edges on each of said terminals, said conductor receiving means being at least partially formed by two arcuate plate-like members, one of said two edges on each of said plate-like members, said two edges being closely adjacent and substantially parallel.

5. An electrical interconnection as set forth in claim 2 wherein said camming member comprises a linearly movable cam, said cam being movable towards and away from said panel board and generally parallel to said posts.

6. An electrical connector for establishing an electrical interconnection between an individual wire and an elongated electrical element, said electrical connector comprising:

an insulating housing having an internal cavity for receipt of said elongated electrical element, a contact terminal for establishing said electrical interconnection, said terminal being located in said housing cavity, a contact surface located on a first face of said contact terminal, a camming member adjacent to a second face of said contact terminal, said second face being on the reverse side of said contact terminal from said first face, said camming member being movable parallel to said terminal, between an open position and a closed position, in said closed position said camming member abutting said second face and urging said contact surface toward said elongated electrical element when located within said cavity, a wire receiving means on said contact terminal, said wire receiving means being positioned to contact a wire moved laterally of its local axis toward said camming member and into said wire receiving means, with said local axis being generally parallel to said contact terminal, and integral strain relief means, on said camming member, said strain relief means comprising channels for preventing movement of said wires laterally of their local axes our of said wire receiving means, whereby said elongated electrical element can be inserted into said cavity when said camming member is in said open position and movement of said camming member to said closed position establishes electrical contact with said elongated electrical element.

7. An electrical connector for establishing an electrical interconnection between an individual wire and an elongated electrical element, said electrical connector comprising:

an insulating housing having an internal cavity for receipt of said elongated electrical element, a contact terminal for establishing said electrical interconnection, said terminal being located in said housing cavity, a contact surface located on a first face of said contact terminal, a camming member adjacent to a second face of said contact terminal, said second face being on the reverse side of said contact terminal from said first face, said camming member being movable parallel to said terminal, between an open position and a closed position, in said closed position said camming member abutting said second face and urging said contact surface toward said elongated electrical element when located within said cavity, a wire receiving means on said contact terminal, said wire receiving means being positioned to contact a wire moved laterally of its local axis toward said camming member and into said wire receiving means, with said local axis being generally parallel to said contact terminal, and gripping means on the end of each of said terminals opposite said wire receiving means for engaging said camming member when said camming member is in said open position whereby an extraction force is exerted through said camming member to remove said connector from said elongated elements, whereby said elongated electrical element can be inserted into said cavity when said camming member is in said open position and movement of said camming member to said closed position establishes electrical contact with said elongated electrical element.

8. An electrical connector for establishing contact with a plurality of terminal posts which are located in an $x$-$y$ matrix, the spacing between adjacent posts in the $x$-direction being equal to $d$, the spacing between adjacent posts in the $y$-direction being equal to $s$, said connector comprising:

a prismatic housing with a forward face which has a width generally equal to and no greater than $2d$, and a length generally equal to and no greater than an integral multiple of said distance $s$, two parallel side-by-side rows of elongated cavities extending inwardly from said forward face into said housing, the centerlines of said rows being spaced apart by said distance $d$, the centerlines of adjacent cavities in each of said rows being spaced apart by said distance $s$, camming means located between said two rows, said camming means being actuated from the rear of said housing, a plurality of spring metal contact terminals, on terminal in each of said cavities, each of said terminals being adjacent to said camming means, each of said terminals having a wire receiving portion located adjacent to the rearward face of said housing, said rearward face being opposite to said forward face, and said wire receiving portions establishing electrical contact with a wire moved laterally of its axis into said wire receiving portion, whereby a plurality of said connectors can be placed in side-by-side and end-to-end with said posts extending into said cavities whereupon said camming means can be actuated and said contact terminals will establish contact with said posts.

9. An electrical connector as set forth in claim 8 wherein said wire receiving portions of said terminals in adjacent rows face in opposite directions.

10. a low-insertion force electrical connector for establishing electrical interconnection between a plurality of individual wires and a plurality of elongated electrical terminal posts of the type suitable for solderless wire wrapping interconnections, said posts being arranged in a densely and uniformly spaced rectangular array, said terminal posts having a generally rectangular cross-section with the sides thereof being parallel to the respective rows and columns of said matrix, said electrical connector comprising:

an insulating housing having a plurality of internal cavities extending inwardly from a front side of said housing, said cavities being arranged in two side-by-side parallel rows, a plate-like contact terminal located in each of said cavities, a contact surface located on a first face of said contact terminal, a camming member located between each of two side-by-side contact terminals, said camming member being adjacent to a second face of said contact terminals, said second face being on the reverse side of each of said contact terminals from said first face, said camming member being movable parallel to said terminal, between an open position and a closed position; in said closed position, said camming member abutting said second face and urging said contact surfaces toward the centerline of the respective cavity, and a wire-receiving means on each of said contact terminals, said wire-receiving means being positioned to establish contact with a wire moved laterally of its local axis toward said camming member and into said wire-receiving means, with said local axis being generally parallel to said contact terminal, whereby, a said terminal post can be inserted into a said cavity when said camming member is in said open position and movement of said camming member to said closed position establishes electrical contact with said terminal post.

11. A low insertion force electrical connector as set forth in claim 10 wherein, adjacent cavities within each of said two rows are separated by an internal wall.

12. A low-insertion force electrical connector as set forth in claim 11 wherein, adjacent cavities in opposite rows are open on the commonly facing internal sides of said cavities, said camming means extending between said last mentioned adjacent cavities, said camming means forming the separating wall between said last mentioned adjacent cavities when said camming means is in the closed position.

13. A zero insertion force electrical connector for establishing contact with a plurality of terminal posts, each having a rectangular cross section, located in an *x*-*y* matrix, the spacing between adjacent posts in the *x*-direction being equal to *d*, the spacing between adjacent posts in the *y*-direction being equal to *s*, the sides of said posts being parallel to said *x* and *y* directions, said connector comprising:

an insulating housing having a generally rectangular prismatic shape with a width generally equal to and no greater than 2*d* and a length generally equal to and no greater than an integral multiple of said distance *s*, two parallel side-by-side rows of elongated cavities, each cavity extending through said housing from a forward face to an opposite rear face, the centerlines of said rows being spaced apart by said distance *d*, the centerlines of adjacent cavities in each of said rows being spaced apart by said distance *s*, a linear cam movable towards and away from said forward face between said to adjacent rows along a plane parallel to adjacent sides of posts in said adjacent rows, a plurality of spring metal contact terminals, one terminal in each of said cavities, a shank portion, on the forward end each said terminal, located between said linear cam and one side of a post located in each said cavity, a contact surface portion on said shank portion, said contact surface portion extending parallel to said last-mentioned side of said post, a wire contact portion on the rear end of each said contact terminal, for establishing contact with a wire having its local axis extending parallel to said shank portion, whereby a plurality of said connectors can be placed side-by-side and end-to-end with said posts extending into said cavities whereupon said camming means can be actuated and said contact terminals will establish contact with said posts.

14. An electrical connector as set forth in claim 13 wherein said wire contact portion on terminals in adjacent rows face outwardly in opposite directions.

15. An electrical connector as set forth in claim 13 wherein said wire contact portion comprises a slotted member.

* * * * *